United States Patent [19]

Polla

[11] Patent Number: 5,536,963
[45] Date of Patent: Jul. 16, 1996

[54] MICRODEVICE WITH FERROELECTRIC FOR SENSING OR APPLYING A FORCE

[75] Inventor: Dennis L. Polla, Brooklyn Park, Minn.

[73] Assignee: Regents of the University of Minnesota, Minneapolis, Minn.

[21] Appl. No.: 241,052

[22] Filed: May 11, 1994

[51] Int. Cl.⁶ ........................................ H01L 29/82
[52] U.S. Cl. .................. 257/417; 257/418; 257/419; 257/420; 73/720
[58] Field of Search .................... 257/415, 417, 257/418, 419, 420, 431, 467; 73/720

[56] References Cited

U.S. PATENT DOCUMENTS

| | | | |
|---|---|---|---|
| 2,478,223 | 8/1949 | Argabrite | 171/327 |
| 5,209,119 | 5/1993 | Polla et al. | 73/720 X |

FOREIGN PATENT DOCUMENTS

| | | |
|---|---|---|
| 4095741 | 3/1992 | Japan . |
| 5126868 | 11/1993 | Japan . |
| 6120578 | 4/1994 | Japan . |
| WO86/06548 | 11/1986 | WIPO . |
| WO92/09111 | 5/1992 | WIPO . |

OTHER PUBLICATIONS

Yi, G., et al., IEEE 1989 Ultrasonics Symposium Proceedings, vol. 2, Oct. 3–6, 1989 pp. 1231–1235.
Goral, J. P., et al., Thin Solid Films, 193/194 (1990) Nos. 1/2, pp. 1017–1022.
Tamagawa, T., et al., IEEE 1990 IEDM: Detectors, Sensors and Displays, 1990, pp. 1–3.

*Primary Examiner*—William Mintel
*Attorney, Agent, or Firm*—Patterson & Keough

[57] ABSTRACT

A micromechanical structure or microactuator based upon the piezoelectric, pyroelectric, and electrostrictive properties of ferroelectric thin film ceramic materials such as PZT with a thickness between 0.1 and 10 micrometers. The thin film ceramic material is sandwiched between first and second electrodes and may contain an intermediate electrically insulating thin film. This structure with electrodes is formed on a deformable or movable structure integral to a semiconductor or bulk ceramic substrate. Electrical connection is established between the upper and lower electrodes. A potential difference or voltage is established between the electrical interconnection points to produce a force, movement, or mechanical deformation. The invention also relates to a method for making such micromechanical structures or microactuators.

4 Claims, 6 Drawing Sheets

MICRODEVICE WITH FERROELECTRIC FOR SENSING OR APPLYING A FORCE

BACKGROUND OF THE INVENTION

1. Field of the Invention

The present invention relates generally to a microstructure for sensing infrared radiation, for deflecting an incident matter, and for applying a force and more particularly to a micromechanical actuating device comprising a thin film of ferroelectric ceramic as the active actuating material. The present invention also relates to a method of making such a microactuator device.

2. Description of the Prior Art

Microactuators such as micromechanical valves and pumps have previously been formed using thin film materials which deform in response to an applied electric field. Other micromechanical devices such as rotating members, micro motors, and microgears have also been fabricated using integrated circuit processing technology. These technologies, however, are severely limited in the amount of usable energy which can be derived from these actuation principles based on applied electrostatic forces. Much larger actuator devices have previously been formed using macro scale, bulk crystal and ceramic materials. These devices have been used in a number of micromechanical positioning applications and applications involving the production of substantially large forces in excess of one newton.

A need exists for truly micro scale devices that can deliver a substantial amount of usable energy.

SUMMARY OF THE INVENTION

In contrast to the prior art, the present invention relates to a microactuator or micromechanical device which uses a thin film of ferroelectric ceramic materials primarily based on the Perovskite crystalline structure of the ceramic materials. In the present invention the ferroelectric ceramic is applied as a thin film with thickness dimensions between about one tenth of a micrometer to ten micrometers and over an effective actuation area of less than about one square centimeter. The physical piezoelectric activity of such ferroelectric thin films and related ceramics has been shown to be significantly higher than pyroelectric materials, thus such materials are capable of delivering a substantially greater amount of usable energy than the previous known devices. Because of the high piezoelectric properties of certain formulations of the Perovskite material family, primarily based on lead zirconate titanate (PZT), such formulations are significantly attractive for both physical actuation as well as micromechanical deformation or movement applications.

The present invention also relates to a method of preparing microactuator and micromechanical devices using the piezoelectric and pyroelectric properties of the above mentioned ferroelectric ceramic thin films. One step of such method includes the deposition of the thin film ferroelectric ceramic onto a base electrode. Although various methods may be useful for the thin film deposition of the ferroelectric ceramics, the preferred method utilizes a sol-gel deposition technique. Other techniques, however, are also attractive. These techniques include thin film sputtering and vapor transport deposition methods.

With such sol-gel techniques, ferroelectric ceramic thin films can be deposited onto thin deformable microstructures formed of common metals, polycrystalline silicon, silicon nitride or thin polymers. The preferred material is based on silicon nitride prepared in a low tensile stress state. When a voltage is applied to such structure, a stress is induced in the PZT thin film which generates a force resulting in a mechanical deformation or movement through its piezoelectric effect. This force can be transduced to move or position another object and contact with the microactuator structure can be used to open or close an orifice, can be used to mechanically constrict or open a fluid passageway, or can be used to selectively deflect incident matter in a desired direction. Typical microactuator applications for thin pyroelectric ceramic films include, among others, liquid dispensing application based on mechanical valves, gas and liquid pumping based on thin deformable diaphragm pumps, physical force generation used in achieving precision positioning such as in magnetic recording heads, and control of deflective surfaces for deflection of incident matter applications, such as altering the aerodynamic characteristics of an airfoil.

Because the thin film ferroelectric ceramic formulations of the present invention also have a high pyroelectric effect, heat sensitive microsensors can also be formed based upon this property by depositing the ferroelectric ceramic thin films on microstructures designed with a low thermal mass. With a structure, such as silicon-nitride having a low thermal mass, negligible heat is dissipated to the underlying silicon wafer structure. With such a structure, change in the temperature of the thin film due to incident heat such as infrared radiation or heat releasing chemical reactions in turn produces a charge across the thin film as a result of the pyroelectric effect of the thin film. Such charge is detected and measured.

From this, the temperature of the object generating the incident heat can be readily determined.

For micromechanical motion or actuator applications, the piezoelectric effect is utilized in the thin film electric ceramic to generate both force and displacement. In such applications, ferroelectric ceramic thin film is deposited onto an appropriate electrode associated with a free standing or partially unconstrained membrane, diaphragm or cantilever. A voltage is applied across the ferroelectric ceramic thin film which induces a volumetric expansion in the ferroelectric ceramic thin film through the inverse piezoelectric effect. Mechanical movement or positioning of an attached load then results. Microactuation and nanoactuation applications include, among others, optical fiber positioning, opening and closing of mechanical valves, actuation of fluid pumps, positioning of information reading devices such as magnetic heads, microsurgery devices, and the like.

In particular ferroelectric ceramic thin film formulations which are desired for exhibiting sufficient piezoelectric properties are primarily based on Perovskite crystalline structure. These materials commonly include lead zironate titanate (PZT), lead titanate ($PbTiO_3$), lanthanum-doped or lanthanum-modified PZT (PLZT), lead zirconate ($PbZrO_3$), lanthanum-doped or lanthanum-modified lead titanate (PLT), neodymium-doped PZT (PNZT), lithium niobate ($LiNbO_3$), lithium tantalate ($LiTaO_3$) and other similar ceramic materials with a Perovskite crystalline structure. The above materials are all commonly prepared by sol-gel deposition techniques and are also compatible with thin film sputtering and vapor transport deposition methods.

A further aspect of the present invention involves making the microactuator or micromechanical device using micromachining or integrated circuit processing techniques. Thus, in its preferred form, the microactuator or micromechanical device of the present invention is mounted on a silicon wafer or die. In such an application, the effective actuation area of the thin film PZT is less than about one millimeter square. Further, unique techniques have been developed for building actuator devices based on cantilevered beams and suspended membranes.

Accordingly, it is an object of the present invention to provide improved microactuator and micromechanical devices based on the piezoelectric properties of the above mentioned materials.

Another object of the present invention is to provide a piezoelectric microactuator or micromechanical device using thin film ferroelectric ceramics with a thickness of about 0.1 to 10 micrometers.

A further object of the present invention is to provide a method for making a microsensor or microactuator device using thin film ferroelectric materials as the active sensor or actuator materials.

Another object of the present invention is to provide a method for making a microactuator, microsensor or micromechanical structure using thin film ferroelectric ceramics and integrated circuit processing techniques.

A still further object of the present invention is to provide a method for making a microactuator cantilever and thin film diaphragm structures.

These and other objects of the present invention will become apparent with reference to the drawings, the description of the preferred embodiment and method and the appended claims.

DESCRIPTION OF THE PREFERRED EMBODIMENT AND METHOD

The broadest aspect of the present invention relates to a microsensor, microactuator or micromechanical structure using the piezo electric or pyroelectric properties of certain formulations of the Perovskite ceramic material structure. Further features of the present invention include among others the specific ferroelectric ceramic formulations which exhibit the desirable piezoelectric properties for the specific application contemplated, the utilization of sol-gel deposition techniques for depositing and creating thin film ferroelectric ceramic thin films and the utilization of integrated circuit or micromachine processing techniques in the formation of the microsensor and micromechanical devices. These and other features of the present invention will be described in greater detail below.

Figure 1A:
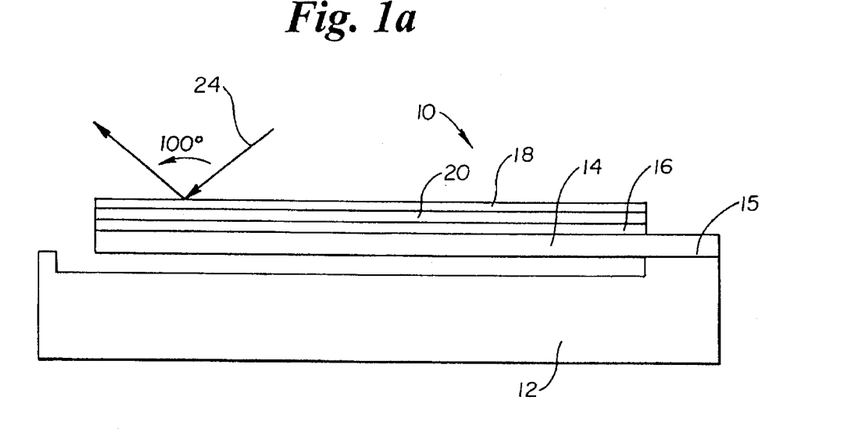
FIG. 1a is a side elevational view of a micromechanical deflector made according to the present invention.

The micromechanical deflector of the present invention is depicted generally at 10 in FIG. 1a. The micromechanical deflector 10 is formed on a silicon wafer or die 12. A cantilever support structure 14 is anchored at a first end 15 to the silicon wafer 12. The support structure 14 is preferably formed of silicon nitride material.

The micromechanical deflector 10 further includes the base or first electrode 16, a top or second electrode 18, and a thin film of ferroelectric ceramic material 20 formed between the electrodes 16, 18. Electrical connection means (not shown) in the form of an electrical lead electrically connects each of the electrodes 16, 18 respectively to opposite poles of a voltage source or battery (not shown).

Figure 1B:
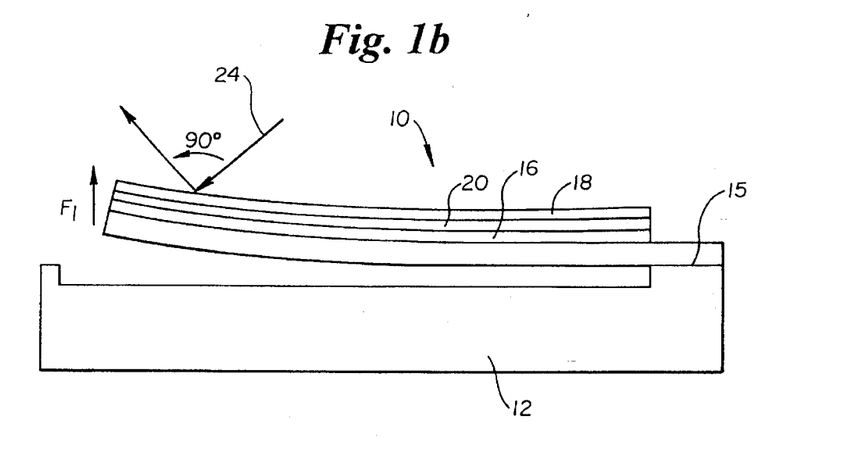
FIG. 1b is a side elevational view of the micromechanical deflector of FIG. 1a depicted in the upward deflecting position.

When a voltage or electric potential is applied to the electrodes 16, 18 and across the ferroelectric thin film ceramic material 20 formed therebetween, certain stresses are generated within the ferroelectric thin film ceramic material 20. This in turn produces a mechanical movement or deformation between the electrodes 16, 18 as a result of the piezoelectric property of the ferroelectric ceramic thin film. Such mechanical movement or deformation is indicated by the arrow $F_1$ depicted in FIG. 1b. This movement can be used to selectively deflect incident matter 24. As depicted in FIG. 1a, the incident matter is deflected at an included angle of approximately 100 degrees. After the deformation depicted in FIG. 1b, incident matter 24 that is impinging upon the micromechanical deflector 10 at the same angle as the matter 24 depicted in FIG. 1a, is deflected at an included angle of approximately 90 degrees.

Figure 1C:
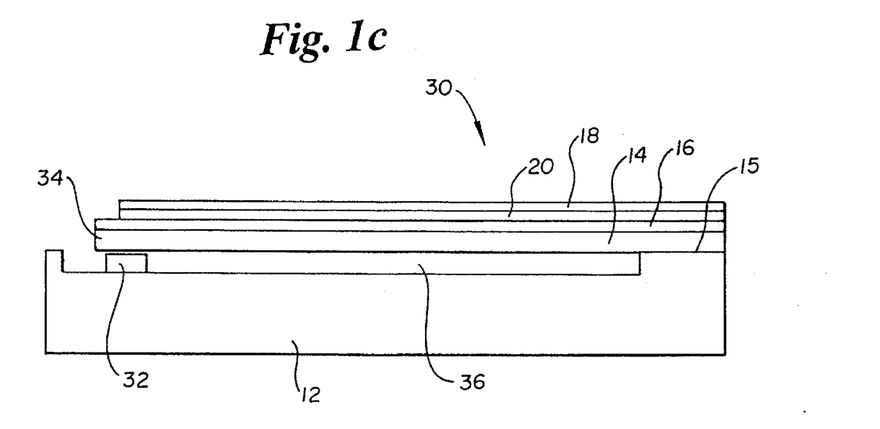
FIG. 1c is a side elevational view of a micromechanical valve made according to the present invention.

FIG. 1c depicts a micromechanical valve generally at 30. The micromechanical valve 30 is of similar construction as the micromechanical deflector 10, with the inclusion sealing pedestal 32. Sealing pedestal 32 is preferably formed of a polycrystalline silicon. With no voltage applied to the electrodes 16, 18, the second end 34 of the support structure 14 rests on sealing pedestal 32 and defines a sealed space 36 within the micromechanical pump 30. A fluid may be sealingly confined within sealed space 36 or a fluid may surround the micromechanical valve 30 and the sealed space 36 may be evacuated. In the first case, as the deformation depicted in FIG. 1b occurs, the support structure 14 separates from the sealing pedestal 32 and the fluid that is confined within sealed space 36 is released. In the second case, as the deformation depicted in FIG. 1b occurs, the fluid surrounding the micromechanical valve 30 is free to enter the sealed space 32. In both cases, the micromechanical valve 30 acts to effect the fluid flow from one region to another region as desired.

Figure 2A:
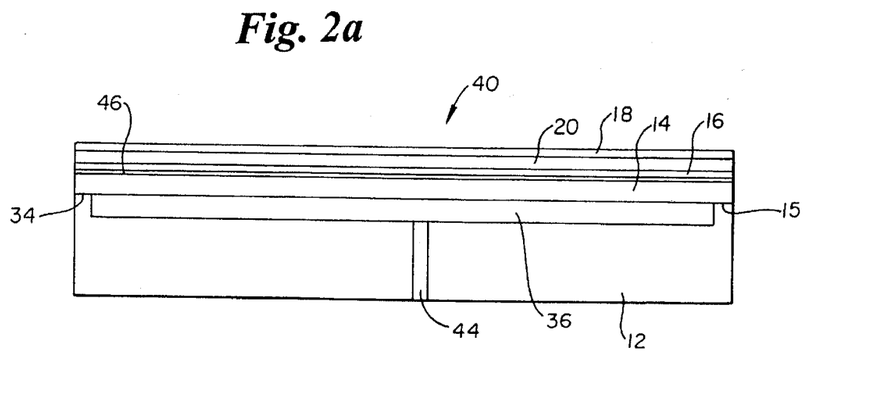
FIG. 2a is a side elevational view of a micromechanical pump made according to the present invention.

In the micromechanical device application of FIG. 2a, a micromechanical pump is depicted generally at 40. The micromechanical pump 40 differs from the embodiment of the micromechanical deflector 10 depicted in FIG. 1a in that the support structure 14 is not cantilevered. Both the first end 15 and the second end 34 of the support structure 14 are bonded to the silicon wafer 12. This bonding defines a sealed space 36 within the micromechanical pump 40. A fluid passageway 44 is defined in the silicon wafer 12. Such fluid passageway 44 permits a fluid to be emplaced within the sealed space 36. The sealed space 36 then acts as a fluid reservoir.

FIG. 2a also depicts an insulative layer 46 that is formed between the first electrode 16 and the ferroelectric thin film ceramic material 20. Such insulative layer 46 is an optional element that is utilized to prevent chemical reactions and chemical diffusion from first electrode 16 to the ferroelectric thin film ceramic material 20.

Figure 2B:
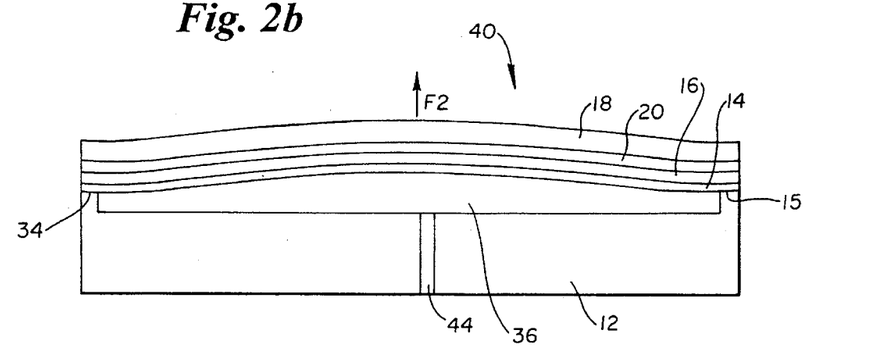
FIG. 2b is a side elevational view of the micromechanical pump of FIG. 2a depicted in the upward deflected position.

FIG. 2b depicts the result of imposing an electrostatic charge on the electrodes 17, 18. Such electrostatic charge has a known polarity. Application of an electrostatic charge via a battery (not shown) produces a corresponding electrostatic charge across the electrodes 16, 18. This, in turn, causes a force or movement to be generated in the direction of the arrow $F_2$ as a result of the piezoelectric properties of the thin film PZT 20. Because the generated force or movement $F_2$ will be proportional to the magnitude of the applied electrostatic charge, such force or movement can be varied by correspondingly changing the electrostatic charge. This can be done with rheostats, switches on chip transistors or other components common in the art.

The deformation that is depicted in FIG. 2b may be utilized to draw a fluid into the sealed space 36. The deformation may also be utilized to apply pressure to a fluid that surrounds the micromechanical pump 40 and to pump such fluid as desired.

Figure 2C:
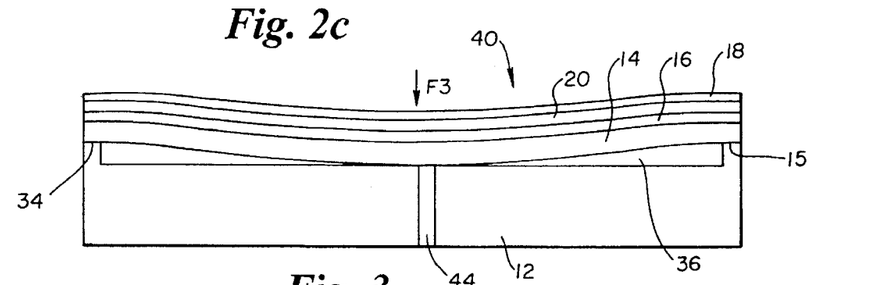
FIG. 2c is a side elevational view of the micromechanical pump of FIG. 2a depicted in the downward deflected position.

FIG. 2c depicts the micromechanical pump 40 having the opposite deformation as that depicted in FIG. 2b. Such deformation results from imposing an electrostatic charge across the electrodes 16, 18 that is of the opposite polarity as the electrostatic charge imposed across the electrodes 16, 18 that resulted in the deformation as depicted in FIG. 2b. Such deformation results from the force indicated at $F_3$. The deformation depicted in FIG. 2c may be utilized to expel a fluid from the sealed space 36. The fluid may be, for example, a therapeutic drug to be delivered from an implanted pump to a patient in nanoliter quantities. A plurality of micromechanical pumps 40 may be incorporated within the pump implanted within the patient.

Figure 3:
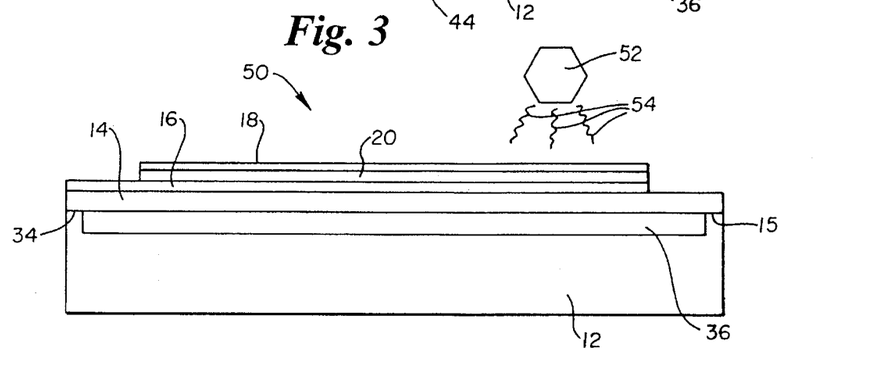
FIG. 3 is a side elevational view of a micromechanical heat sensor made according to the present invention.

In the micromechanical device application of FIG. 3, a pyroelectric infrared detector is depicted generally at 50. As with previous embodiments, a thin film of ferroelectric ceramic material 20 is sandwiched between a base or first electrode 16 and the top or second electrode 18. It is important to realize that the thin film of ferroelectric ceramic material 20 is the same as previously disclosed. In this application, however the pyroelectric properties of the ferroelectric ceramic material 20 are being exploited as distinct from the deformation properties.

Electrical connection means (not shown) in the form of the electrical leads electrically connect the electrodes 16 and 18, respectively, with a volt meter or other electric potential sensing device. Exposure of the infrared detector 50 to incident radiation from a body 52, such as thermal radiation 54 given off by warm objects, produces a charge on the electrodes 16, 18 surrounding the pyroelectric ceramic material 20. This in turn causes a voltage to be produced and sensed by the connected multimeter or volt meter (not shown) connected to the infrared detector 50. The amount of charge generated or voltage produced is proportional to the intensity of the warm object. The warm body 52 heats the pyroelectric ceramic material 20 thereby changing the internal dipole moment of the oriented ferroelectric ceramic material 20. An electrical signature characteristic of the temperature of the warm body 52 is read out with a voltmeter, multimeter, or other appropriate charge or electric potential sensing device.

The thickness of the thin film PZT 20, as depicted in the above described embodiments, will be determined by several factors, including, among others, the particular piezoelectric properties desired, the specific application of the device and the method utilized to deposit the thin film 20. Generally, for applications contemplated by the present invention, the PZT film 20 will be between about 0.1 and 5 microns. For applications as a microsensor illustrated in FIG. 3, the preferred thickness of the PZT film 20 is between about 0.1 and 1.0 microns and preferably about 0.5 microns. For applications as a micromechanical device illustrated by FIGS. 1a, 1b, 1c, 2a, 2b, and 2c, the preferred thickness of the PZT film 20 is between about 1.0 and 5 microns and most preferably about 2.0 microns.

In the preferred embodiment, the formulation of the ferroelectric ceramic material 20 is selected so that its piezoelectric and pyroelectric properties are optimized for the particular application desired. For applications contemplated by the present invention, the particular ferroelectric ceramic formulation is one that exhibits and possesses a Perovskite crystalline structure. Preferably a formulation based on lead zirconate titanate (PZT) comprises a zirconate to titanate ratio from about 94:6 to about 30:70. Most preferably, the PZT composition comprises a zirconate titanate ratio of about 54:46 or composition near the morphotrophic phase boundary of the material. Additional incorporation of dopants such as lanthanum or niobium are used to modify the dielectric properties of the ferroelectric ceramic material 20. Such dopants also influence the piezoelectric and pyroelectric performance properties of the ferroelectric ceramic material 20. In particular, the intentional incorporation of lanthanum with a composition of approximately nine percent produces an extremely large electrostrictive effect in the PZT ceramic material 20. This in turn allows extremely large deflections to be produced in the applications described in FIGS. 1a, 1b, 1c, 2a, 2b, and 2c. The intentional incorporation of lanthanum with a composition of approximately three percent in PZT or lead titanate (PT) has the effect of reducing the dielectric loss associated with the ferroelectric ceramic material 20. This is extremely important in improving the pyroelectric response and signal to noise ratio of the infrared detector structures contemplated in this invention as depicted in FIG. 3.

The thickness of the thin film ferroelectric materials 20 is determined by several factors including, among others, the particular piezoelectric or pyroelectric properties desired, the specific application of the device, the method utilized to deposit the film, and practical restraints associated with integrated circuit processing methods, photolithography and micromachining techniques. Generally, for other applications contemplated by the present invention the ferroelectric ceramic film 20 will be between about 0.1 and 10 micrometers. For applications as a infrared detector 50 illustrated in FIG. 3, the preferred thickness of the ferroelectric ceramic material is approximately between 0.1 and 1 micrometer and preferably about 3000 angstroms or 0.3 micrometers. For the pyroelectric detector 10 application of the present invention the preferred ferroelectric ceramic material composition is lead titanate or lanthanum-doped lead titanate. For applications as a micromechanical device 10, 30, and 40, illustrated in FIGS. 1a, 1b, 1c, 2a, 2b, and 2c, the preferred thickness of the ferroelectric material 20 is between about 0.2 and 5 micrometers and most preferably about 0.5 micrometers. The preferred material composition of the ferroelectric ceramic is PZT with a composition of 54:46.

The terms microdevice or microsensor and micromechanical device as used herein are intended to mean sensor, actuator and mechanical devices which are formed on a semiconductor substrate such as a silicon wafer or die 12 for use in the formation of a chip. Generally, such wafers 12 have a thickness of between about 0.2 and 2 mm and preferably less than 1 mm. It is contemplated that the size of the effective sensing or actuation portion of the thin film ferroelectric ceramic 20 on such wafers 12 is less than about one millimeter square ($10^6$ square microns) and greater than about 5 microns square. The effective portion of the ferroelectric ceramic film 20 is that portion of the film 20 between the electrodes 16, 18.

The structure of the electrodes 16, 18 in FIGS. 1a, 1b, 1c, 2a, 2b, and 2c, and 3 may be selected from a variety of metals commonly used as electrodes. The particular material which is preferred will depend on various functions including, among others, the method of producing the thin film ferroelectric ceramic 20 and the particular application of the device. Of the electrodes 16, 18, the base electrodes 16 are most important since the electrodes 16 are the electrodes on which the ferroelectric ceramic material 20 is deposited.

A principal requirement of the base electrode 16 is that it be compatible with the formation of the desired crystalline structure of the thin film ferroelectric ceramic 20, namely, the Perovskite structure. This results in a film 20 capable of exhibiting the desired piezoelectric or pyroelectric properties so that it will function in the manner intended. It has been found that for the base electrode 16 the preferred material is platinum. Platinum is compatible with, and results in, formation of the desired crystalline structure of the ferroelectric thin film 20 exhibiting the desired high piezoelectric properties. The top or second electrode 18 can include a variety of conductive metals commonly used as electrodes such as gold, silver, platinum, copper and the like. The preferred material for the top or second electrode 18 is gold. The preferred upper or top electrode 18 for the case of pyroelectric detector 50 is nickel chromium.

An important step in the method of producing the microsensor, microactuator or micromechanical device of the present invention includes the formation of the thin ferroelectric ceramic 20 on the base electrode 16. One technique for forming such film is a technique known as sputtering. In general, sputtering involves the application of a thin film material by applying a high electric field between a solid target material and a grounded substrate onto which the film is to be formed. As a result of the electric field, particles are caused to fall from the target material to the substrate, thereby creating the thin film. A limitation of using a sputtering deposition technique to create ferroelectric ceramic thin films, however, is the extreme difficulty in getting the right composition in the thin film layer. When dealing with PZT, the specific formulation, and more particularly, the ratio of zirconate to titanate will determine the piezoelectric properties of the film. Thus, if it is desired to alter the zirconate to titanate ratio of the film when using sputtering deposition, a new target material with a new formulation must be prepared. This is a demanding task. Producing the desired composition of the PZT film is further complicated by the fact that the composition of the PZT film formed on the substrate is not necessarily identical to the composition of the target material and is often not uniform over the deposited area. Further, formation of thin film PZT by sputtering is not particularly good at withstanding certain chemical etching processes after the thin film has been performed.

In general, the transport deposition techniques are based on transporting, in a gaseous phase, the desired ferroelectric ceramic materials 20 over a heated wafer 12 surface. As a result of condensation of the vapor materials, a thin form of the desired ferroelectric ceramic material 20 is deposited. A limitation of using vapor phase transport of gases to create the ferroelectric thin film however, is the extreme toxicity of many of the materials needed to form the gaseous transport materials. The toxicity associated with these gases often requires excessive safety measures, expensive alarm monitoring systems and additional expense.

The preferred method for forming the thin film ferroelectric ceramic in accordance with the present invention is the use of sol-gel deposition technologies. Sol-gel deposition techniques generally involve preparation of a chemical solution and application of such chemical solution to the substrate or surface either by dipping or by spin-coating. With a spin-coating technique, the solution is dispensed and the substrate is spun at a rate of between 1,000 to 4,000 revolutions per minute. This results in the formation of a thin film or coating over the entire surface of the substrate. Using sol-gel spin-coating techniques, coatings of about 0.1 micrometers in thickness can be applied. Further details regarding sol-gel deposition technology are available in the prior art.

One advantage of using sol-gel deposition techniques is the ability to better control the composition of the thin film 20 being deposited. As well as allowing for the easy additional incorporation of imparity dopants such as lanthanum and neodymium. For example, if a different film composition is desired, such difference can be accomplished merely by altering the chemical solution of the liquid which is dispensed onto the spinning substrate. This is particularly advantageous in enabling the film compositions to be altered so as to optimize their characteristics for specific sensor and actuator applications. Still further, sol-gel techniques allow for more efficient experimentation with film composition to obtain optimum properties. The thickness of the film formed using sol-gel techniques is dependent on a number of factors, including, among others, the makeup of the solution which is being deposited and the speed at which the substrate is rotated. Preferably, application of sol-gel deposition techniques in accordance with the present invention will deposit a film of approximately 0.1 micrometers or less in thickness. Thus, if thicker films are desired, the sol-gel process is repeated as many times as is necessary to achieve the desired thickness.

An existing problem in the formation of thin film ferroelectric ceramic 20 compositions is the tendency of the film to crack when stressed. This problem becomes greater as the film 20 becomes thicker. The problem also becomes greater as the stresses to which the film 20 is subjected during use become greater. In accordance with the present invention, the problem is overcome by sequential deposition and curing of a plurality of PZT layers. Preferably individual layers of ferroelectric ceramic are applied by spin coating at a thickness no greater than 0.2 micrometers and most preferably at a thickness no greater than 0.1 micrometers. Following each deposition, the ferroelectric ceramic is cured at its appropriate temperature. For PZT this is approximately 400° C. for 20 minutes. While the time and temperature may vary, they must be sufficient to drive off organic solvents of the ferroelectric ceramic solutions and crystallize the ferroelectric material to the proper phase. Following the deposition of layers with total thickness of about 0.2 micrometers, the ferroelectric ceramic is cured at a temperature greater than 550° C. and preferably about 650° C. for 20 minutes to form the desired Perovskite crystalline structure in the ferroelectric ceramic. The temperature of about 650° C. for PZT is necessary for this crystalline structure to form. Alternatively, each cure following each deposit can be cured at a temperature greater than 550° C. and preferably at 650° C. It has been found that the above sequential deposit and cured steps minimize PZT cracking and adhesion problems.

It is contemplated that the production of the microsensors, microactuators and micromechanical devices in accordance with the present invention will use integrated circuit processing and production techniques. In general, integrated circuit processing and production techniques involve sequentially depositing or forming various layers or portions of layers onto a semiconductor substrate such as a silicon wafer or die 12. These layers or portions of layers are generally formed by a series of material depositions followed by selective removal or patterning of certain portions of the deposition by photolithograph and etching. The details of incorporation of integrated circuit processing techniques with the use of thin film ceramic materials in the production of microsensors, microactuators and micromechanical devices according to the present invention can be understood best with reference to FIGS. 4A–4P.

FIG. 4 comprises a series of figures (A–P) illustrating the sequential fabrication of a micromechanical actuator (deflector) for fluid control applications. This structure generically demonstrates similar fabrication steps involved in making the other microsensor, microactuator, and micromechanical devices previously discussed. In FIGS. 4A–4P the same components have been given the same reference numerals as used in FIGS. 1, 2, and 3. Referring to FIG. 4A, generally, the process includes first providing a substrate 12 onto which the various structural components of the sensor, actuator, and micromechanical device are to be formed. This substrate 12 can be constructed of insulating materials such as quartz or sapphire, but preferably is constructed of a semiconductor such as silicon which is economical and easy to work with. In the preferred embodiment, the substrate 12 is a round silicon wafer of the type commonly used in the production of integrated circuit dies having a thickness of between 0.2 and 0.8 mm and surface diameter between about 2 mm and 20 mm thus having a usable surface area of between about 3 and 300 square mm.

Figure 4A:
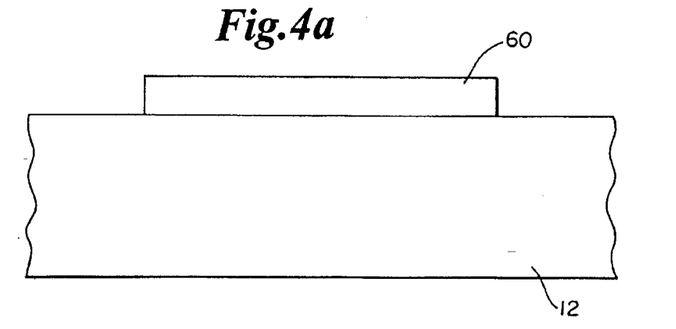
FIG. 4a–4p represent sequential steps in the production of a surface-micromechanical actuator and sensor made in accordance with the present invention.
Figure 4B:
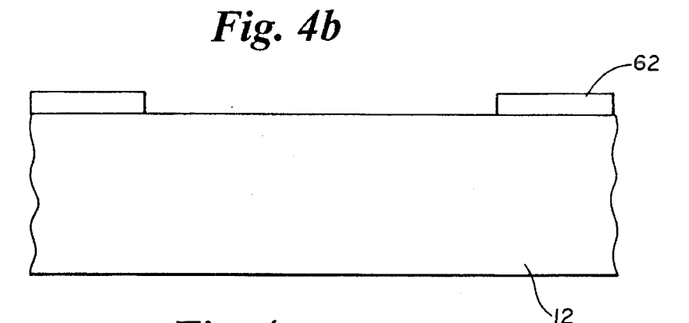

As shown in FIG. 4A, the substrate 12 is first cleaned and its surface is covered with a layer of photoresist 60 and selectively patterned. An aluminum 62 protection masking material is then deposited on the wafer and selectively lifted off in the wafer area covered by photoresist as shown in FIG. 4B.

Figure 4C:
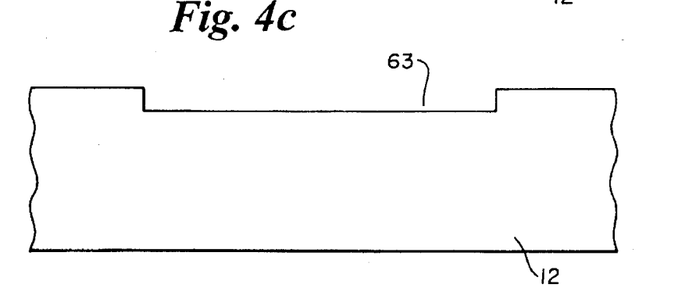

Next, as shown in FIG. 4C, the silicon wafer is selectively etched in a $CF_4/O_2$ plasma to a depth of 0.5 micrometers in the preferred embodiment. The protective aluminum layer is then removed by a standard commercial aluminum stripping solution.

Figure 4D:
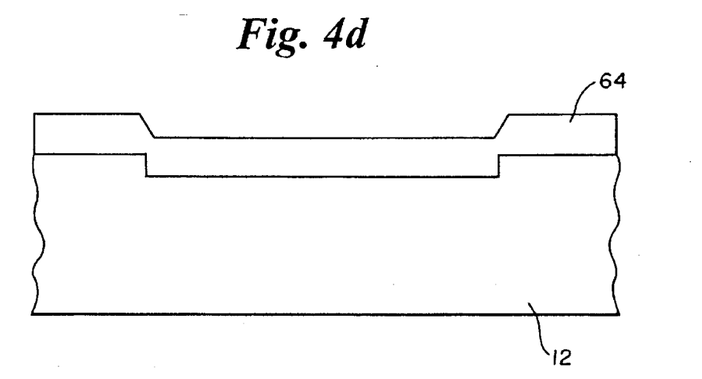

As shown in FIG. 4C, the wafer contains trenches 63, which eventually form air gaps, channels, and passage ways in the devices claimed, including sealed space 36. A blanket deposition of silicon dioxide glass 64 is then performed as shown in FIG. 4D by low-pressure chemical vapor deposition (LPCVD). In the preferred embodiment, the silicon dioxide glass is deposited to a thickness of 1.5 to 3.5 micrometers, the first 0.15 micrometers of which is an undoped oxide followed by the additional deposition of a silicon oxide with in situ phosphorous doping. This later type of silicon dioxide is well known in the integrated circuit processing industry and is commonly referred to a phosphosilicate glass, or simply PSG. The intentional doping with phosphorus in this application allows for both rapid and controlled removal of the silicon dioxide by lateral chemical etching.

Figure 4E:
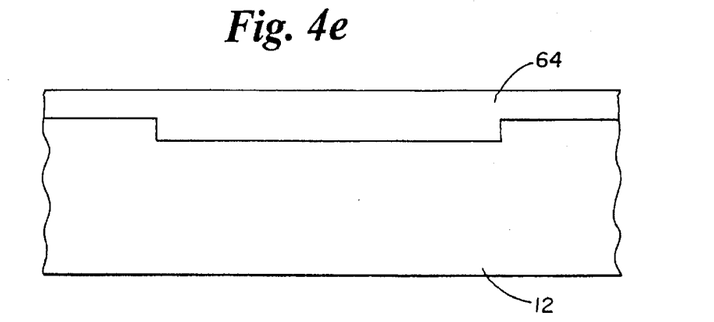

Next, as shown in FIG. 4E, the PSG 64 is densified and reflowed by thermal processing in a wet oxygen ambient at 950° C. for 15 minutes. This planarizes or flattens the topographical variation over the surface of the wafer.

Figure 4F:
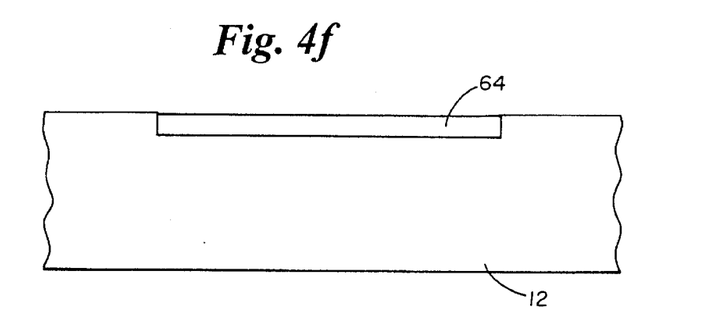

Next, the PSG 64 is patterned by conventional photoresist-photolithography and selectively etched (commonly referred to as an etchback technique) using a sequential combination of $CF_4/O_2$ and buffered hydrofluoric acid BHF, both etchants being commonly used in the manufacture of silicon integrated circuits. A relatively flat surface is thereby reestablished by this process as shown in FIG. 4F.

Figure 4G:
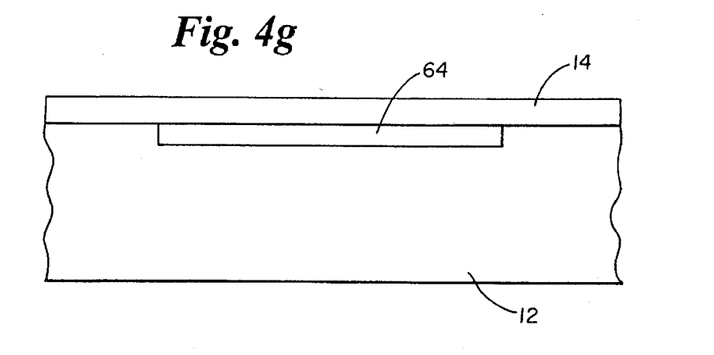

Next, as shown in FIG. 4G, a layer of silicon nitride 14 is deposited by low-pressure chemical vapor deposition to a thickness of approximately 0.5 to 3.0 micrometers. In the preferred embodiment the silicon nitride film thickness is selected to be 2.0 micrometers to have good structural integrity.

In microsensor, microactuator, and micromechanical device applications involving ferroelectric thin films, lower electrode 16 adhesion to the silicon nitride membrane 14 has often been difficult to achieve. The additional deposition of an undoped layer of polycrystalline silicon with a thickness of approximately 0.25 micrometers may optionally be used as an adhesion covering for the silicon nitride structural membrane 14.

Figure 4H:
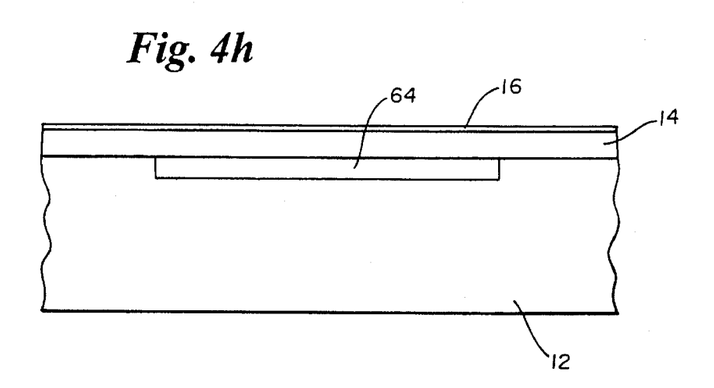

Next, the lower electrode 16 for the microsensor and microactuator structures is formed as shown in FIG. 4H. Several different materials may be used for this base electrode, but the choice is restricted by the particular ferroelectric crystalline properties desired, requirement of having a chemically stable base electrode surface, and requirement of good adhesion and low stress. The lower electrode is formed in the preferred embodiment by the sequential sputtering of titanium and platinum. The titanium thickness is 0.05 micrometers and the platinum thickness is 0.25 micrometers. It is commonly recognized that the titanium promotes good adhesion of the underlying surface to platinum and that platinum represents a common electrode surface upon which oriented Perovskite ceramic thin films can be prepared.

Figure 4I:
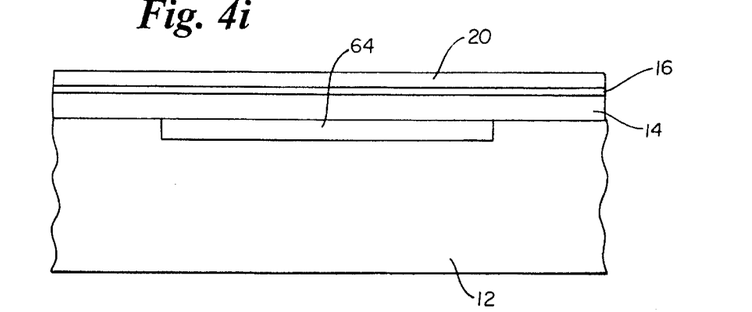

Next, a thin film layer of ferroelectric ceramic 20 is deposited over the entire surface of the substrate as shown in FIG. 4I. In the preferred embodiment, the ferroelectric material selected is PZT and is deposited using sol-gel techniques to a thickness between 0.1 to 10 micrometers with a preferable thickness of approximately 0.35 micrometers. To achieve this thickness, several sol-gel deposition steps are performed. Between deposition steps, the PZT is cured to drive off organic components in the manner previously described.

Figure 4J:
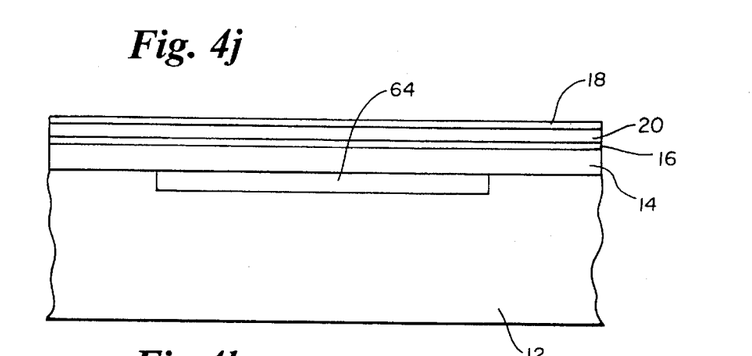

Following deposition of the thin film ferroelectric layer 20, an upper electrode 18 is formed by sputtering titanium and platinum in approximately the same thicknesses as used for the lower electrode 16 as shown in FIG. 4J. The upper electrode 18 is then patterned using photolithography techniques.

Figure 4K:
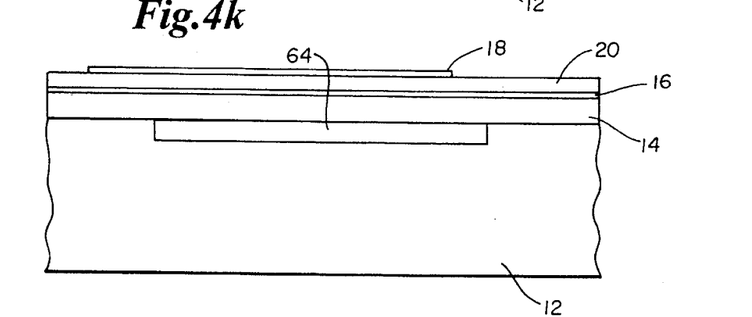

The titanium and platinum (Ti/Pt) layers are etched by ion beam milling to form the desired top electrode patterns as shown in FIG. 4K.

Figure 4L:
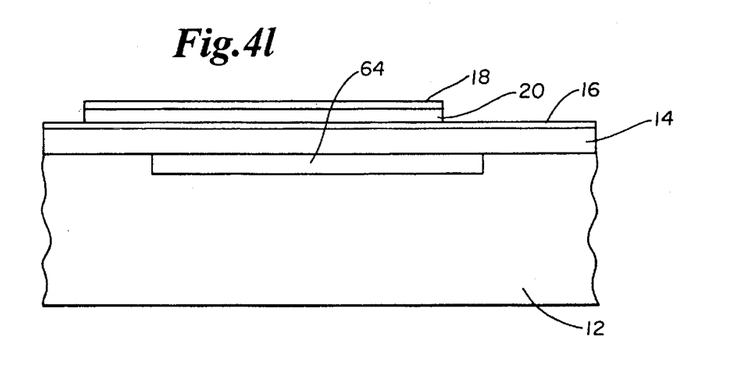

Next, as shown in FIG. 4L, the exposed ferroelectric ceramic 20 is then etched, if needed, by the either dry or wet chemical etching techniques. In the preferred embodiment, a solution of $H_2O:HCl:HF$ in a ratio of 10:10:1 is used to etch PZT 20.

Figure 4M:
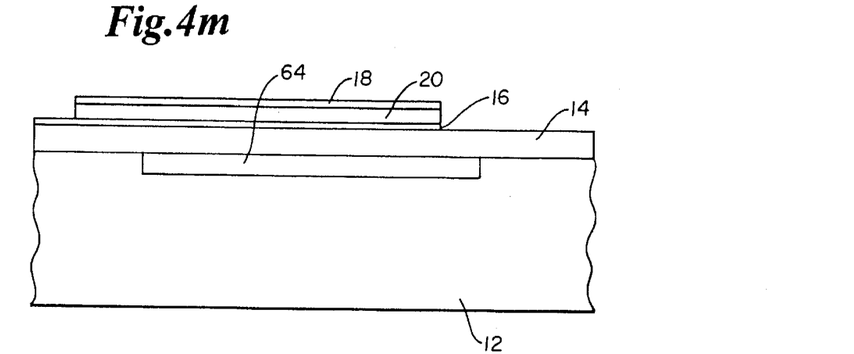

An additional photolithography step is then applied and the unprotected regions of the lower electrode 16 are etched by ion beam milling techniques as shown in FIG. 4M.

Figure 4N:
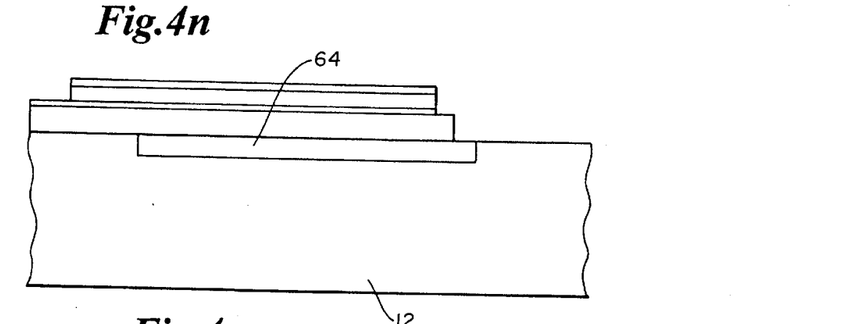

The final patterning of the silicon nitride structural support is then formed by photolithography and selective dry etching as shown in FIG. 4N. Here standard $CF_4/O_2$ drying etching is used exposing the underlying PSG layer.

Before the final chemical undercutting of the structural membrane and depending on the device application, additional electrical interconnection metals 66 and inter-level dielectric materials may be selectively deposited and patterned. This is particularly, important if the starting wafer contained encapsulated integrated circuits already fabricated to the point of electrical contact openings. On-chip transistors are not shown in the simple representative structures described in FIGS. 1, 2, and 3 but could have been already present on the wafer at the starting point depicted in FIG. 4A. If these integrated circuits have already been formed, then at least one additional aluminum interconnection electrode 66 and possible silicon dioxide passivation layers would need to be deposited at this point. The formation of inter-level dielectrics and final aluminum metalization is well known and understood in the manufacture of integrated circuits.

Figure 4O:
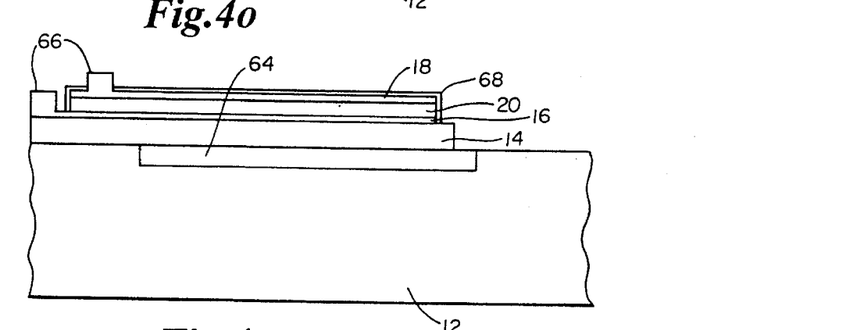
Figure 4P:
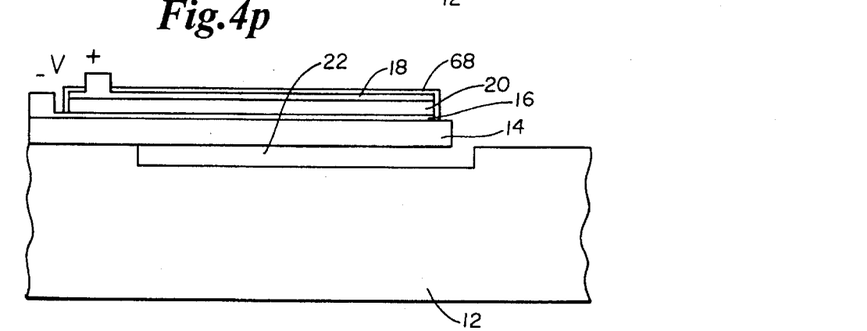

Final undercutting of the PSG 64 is then performed. This requires a thick photoresist to be used in protecting the two electrodes 16 and 18 surrounding the ferroelectric thin film 20 as well as the ferroelectric thin film itself. Additional protection to the subsequent chemical undercutting of the PSG 64 may be required. The use of plasma deposited amorphous materials 68 may be used as needed depending on the length of time with which the photoresist must selectively withstand the imposed chemical etching environment. In the extreme cases not necessarily representative of the simple embodiments shown in FIGS. 1, 2, and 3, a additional amorphous layer of plasma-deposited silicon nitride or other protective material 66 is used to conformally coat the exposed edges of the electrodes 16 and 18 and ferroelectric thin film ceramic 20 as shown in FIG. 4O. The final step involves the chemical undercutting of the silicon nitride membrane wherein the PSG layer is completely etched by hydrofluoric acid or buffered hydrofluoric acid (BHF). Upon completion of this etching step a free standing composite beam is formed as shown in FIGS. 4P and 1 and for the suspended diaphragm shown in FIGS. 2 and 3.

A critical issue involved in the fabrication of the micromechanical structures described in this patent is the structural integrity of the free standing composite material membranes and diaphragms. In order to avoid mechanical shock to these structures as commonly encountered in ordinary integrated circuit chemical rinsing and drying steps, final undercutting, or freeing, of the micromechanical structures is done as one of the final processing steps. Because the beams and diaphragms formed are suspended, application of a voltage between electrodes 16 and 18 induces a stress across the ceramic material 20. This stress produces a deflection in the freely suspended region of the micromechanical structure, the upward or downward movement being determined by the polarity of the applied voltage. This stress can further be converted into a force to be transduced to an object not fabricated as part of the structure described. Conversely, for the operation as an infrared detector 50, a voltmeter is connected between the upper and lower electrodes and a voltage signal is read out proportional to the average temperature increase seen by the ferroelectric ceramic thin film 20. The low thermal conductance of the silicon nitride structural support 14 prevents the unwanted heat loss of the incident warm object from being lost to the substrate 12. Although the description of the preferred embodiment has been quite specific and most applicable to the formation of a deflector or valve, various modifications can be made without deviating from the spirit of the present invention. Accordingly, it is intended that the scope of the present invention be dictated by the appended claims rather than by the description of the preferred embodiment.

I claim:

1. A microdevice formed integral to an integrated circuit chip for generating a force or mechanical movement comprising:

a ferroelectric thin film ceramic having a thickness between about 0.1 and 10 micrometers, said thin film presenting a surface upon which said force is generated and being adaptable for deflective movement in response to the application of an electric field;

first and second electrodes positioned on opposite sides of said ferroelectric thin film ceramic, each of said electrodes having an inner surface in operable contact with said ferroelectric ceramic thin film;

an electrically insulating thin film surrounding said ferroelectric ceramic thin film and being disposed between said first and Second electrodes and said ferroelectric ceramic thin film;

structural supporting material formed of additional deposited thin film material; and electrical connection means for electrically connecting said first and second electrodes to a power supply.

2. A microdevice formed integral to an integrated circuit chip for generating a force or mechanical movement comprising:

a ferroelectric thin film ceramic having a thickness between about 0.1 and 10 micrometers, said thin film presenting a surface upon which said force is generated and being adaptable for deflective movement in response to the application of an electric field;

first and second electrodes positioned on opposite sides of said ferroelectric thin film ceramic, each of said electrodes having an inner surface in operable contact with said ferroelectric ceramic thin film;

structural supporting material formed of additional deposited thin film material; and electrical connection means for electrically connecting said first and second electrodes to a power supply, wherein said ferroelectric thin film ceramic is an integral part of a microvalve which when electrically actuated is adapted to selectively open and close an orifice, constrict and open a fluid passage-way, and establish and break an electrical interconnection.

3. A microdevice formed integral to an integrated circuit chip for generating a force or mechanical movement comprising:

a ferroelectric thin film ceramic having a thickness between about 0.1 and 10 micrometers, said thin film presenting a surface upon which said force is generated and being adaptable for deflective movement in response to the application of an electric field;

first and second electrodes positioned on opposite sides of said ferroelectric thin film ceramic, each of said electrodes having an inner surface in operable contact with said ferroelectric ceramic thin film;

structural supporting material formed of additional deposited thin film material; and electrical connection means for electrically connecting said first and second electrodes to a power supply, wherein the ferroelectric ceramic material has a Perovskite crystalline structure and is selected from the group consisting of:

lead-zirconate titanate (PZT), lead titanate ($PbTiO_3$), lanthanum-doped or lanthanum-modified PZT (PLZT), lead-zirconate (PbZrO$_3$), lanthanum-doped or lanthanum-modified lead-titanate (PLT), and neodymium-doped PZT (PNZT), lithium niobate (LiNbO$_3$), lithium tantalate (LITaO$_3$), and wherein the incident heat is detected via the pyroelectric effect which exists in said ferroelectric thin film ceramic materials and the structural support is fabricated directly above a transistor or transistor circuit located on the surface of a semiconductor wafer.

4. A microdevice formed integral to an integrated circuit chip for generating a force or mechanical movement comprising:

a ferroelectric thin film ceramic having a thickness between about 0.1 and 10 micrometers, said thin film presenting a surface upon which said force is generated and being adaptable for deflective movement in response to the application of an electric field;

first and second electrodes positioned on opposite sides of said ferroelectric thin film ceramic, each of said electrodes having an inner surface in operable contact with said ferroelectric ceramic thin film;

structural supporting material formed of additional deposited thin film material; and electrical connection means for electrically connecting said first and second electrodes to a power supply, wherein silicon nitride is employed as a chemical encapsulation material for said ferroelectric thin film.

\* \* \* \* \*